US008446713B2

(12) United States Patent
Lai

(10) Patent No.: US 8,446,713 B2
(45) Date of Patent: May 21, 2013

(54) WATERPROOF BUTTON AND ELECTRONIC DEVICE USING THE SAME

(75) Inventor: Jin-Shi Lai, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 400 days.

(21) Appl. No.: 12/959,280

(22) Filed: Dec. 2, 2010

(65) Prior Publication Data

US 2012/0069501 A1 Mar. 22, 2012

(30) Foreign Application Priority Data

Sep. 16, 2010 (CN) .......................... 2010 1 0284741

(51) Int. Cl.
*H05K 5/00* (2006.01)
*H05K 7/00* (2006.01)
*G06F 1/16* (2006.01)

(52) U.S. Cl.
USPC .............. 361/679.02; 361/679.01; 361/679.3; 361/679.56

(58) Field of Classification Search
USPC ................ 361/679.01, 679.02, 679.3, 679.56
See application file for complete search history.

(56) References Cited

U.S. PATENT DOCUMENTS

| | | | | |
|---|---|---|---|---|
| 6,963,039 | B1 * | 11/2005 | Weng et al. | 200/302.1 |
| 8,263,886 | B2 * | 9/2012 | Lin et al. | 200/302.2 |
| 2002/0000976 | A1 * | 1/2002 | Salminen et al. | 345/169 |
| 2011/0005908 | A1 * | 1/2011 | Lin et al. | 200/302.2 |
| 2011/0228454 | A1 * | 9/2011 | Chen et al. | 361/679.01 |
| 2012/0067711 | A1 * | 3/2012 | Yang | 200/341 |

FOREIGN PATENT DOCUMENTS

| | | |
|---|---|---|
| CN | 1199915 | 11/1998 |
| JP | 6-58532 | 8/1994 |

* cited by examiner

*Primary Examiner* — Anthony Haughton
(74) *Attorney, Agent, or Firm* — Altis Law Group, Inc.

(57) ABSTRACT

A button assembly applied on an electronic device is provided. An electronic device includes a housing and a button assembly. The housing defines two through holes and includes a first latching member. The button assembly includes a button body and a sealing frame. The button body includes two keycaps and a waterproof layer. Each of the keycaps extends through one of the through holes and is external to the housing. The waterproof layer is made of elastic waterproof material. The sealing frame includes a second latching member and is fixed to the housing. The waterproof layer corresponding to the first latching member and the second latching member is deformed, which creates waterproof seal.

9 Claims, 5 Drawing Sheets

WATERPROOF BUTTON AND ELECTRONIC DEVICE USING THE SAME

BACKGROUND

1. Technical Field

The present disclosure relates to buttons and electronic devices with buttons and, particularly, to a waterproof button and electronic device using the waterproof button.

2. Description of Related Art

Electronic devices such as cell phones often include a number of mechanical buttons. Due to the gap between the buttons and the housing of the device, water may penetrate the device and cause damage.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
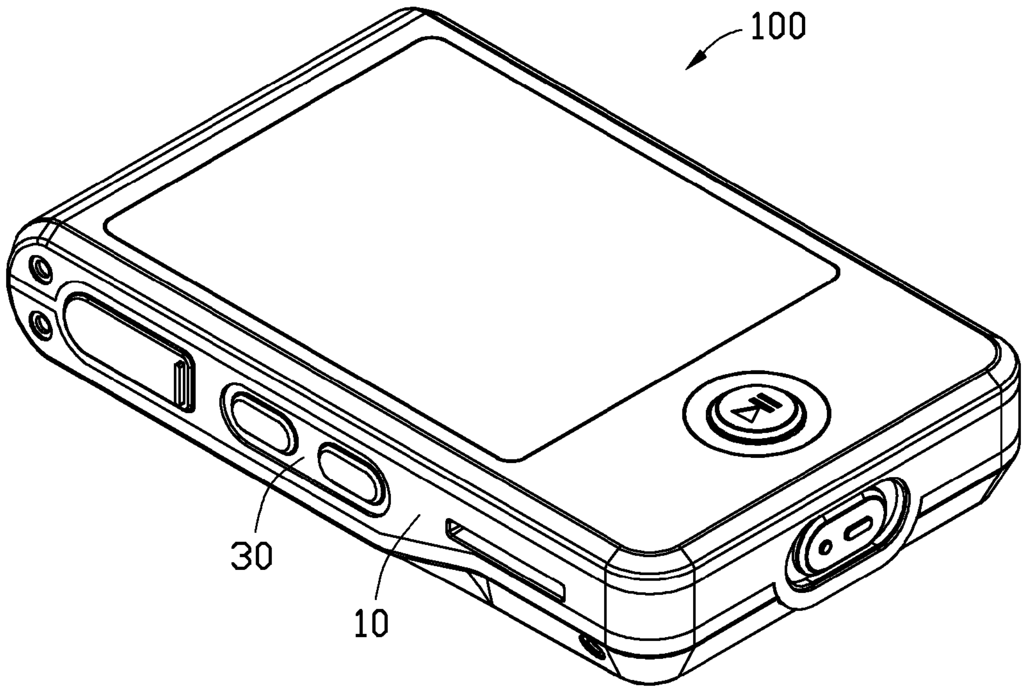
FIG. 1 is an isometric view of an electronic device in accordance with an exemplary embodiment
Figure 2:
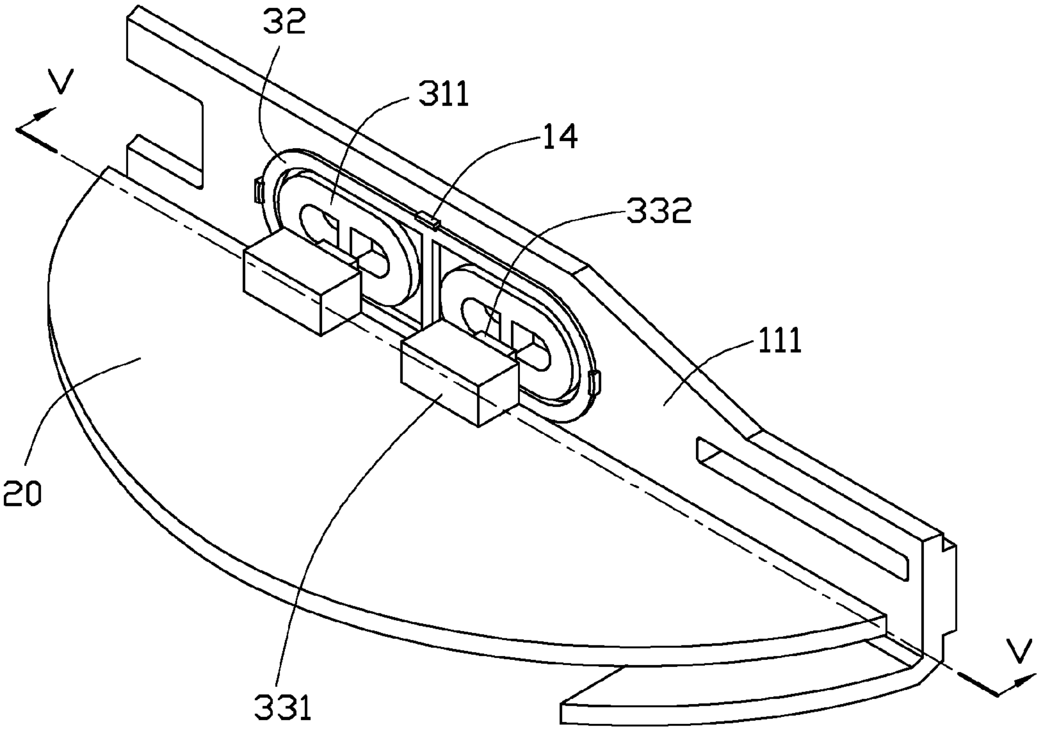
FIG. 2 is a partial, isometric view of the electronic device of FIG. 1, showing a button from the inside.

Referring to FIGS. 1 and 2, an electronic device 100 includes a housing 10, a printed circuit board (PCB) 20, and a button assembly 30. The electronic device 100 can be, for example, a notebook computer, a cell phone, an e-book, a portable music player, etc. In the embodiment, the electronic device 100 is a portable music player. The PCB 20 is fixed in the housing 10. The button assembly 30 is partially received in the housing 10.

Figure 3:
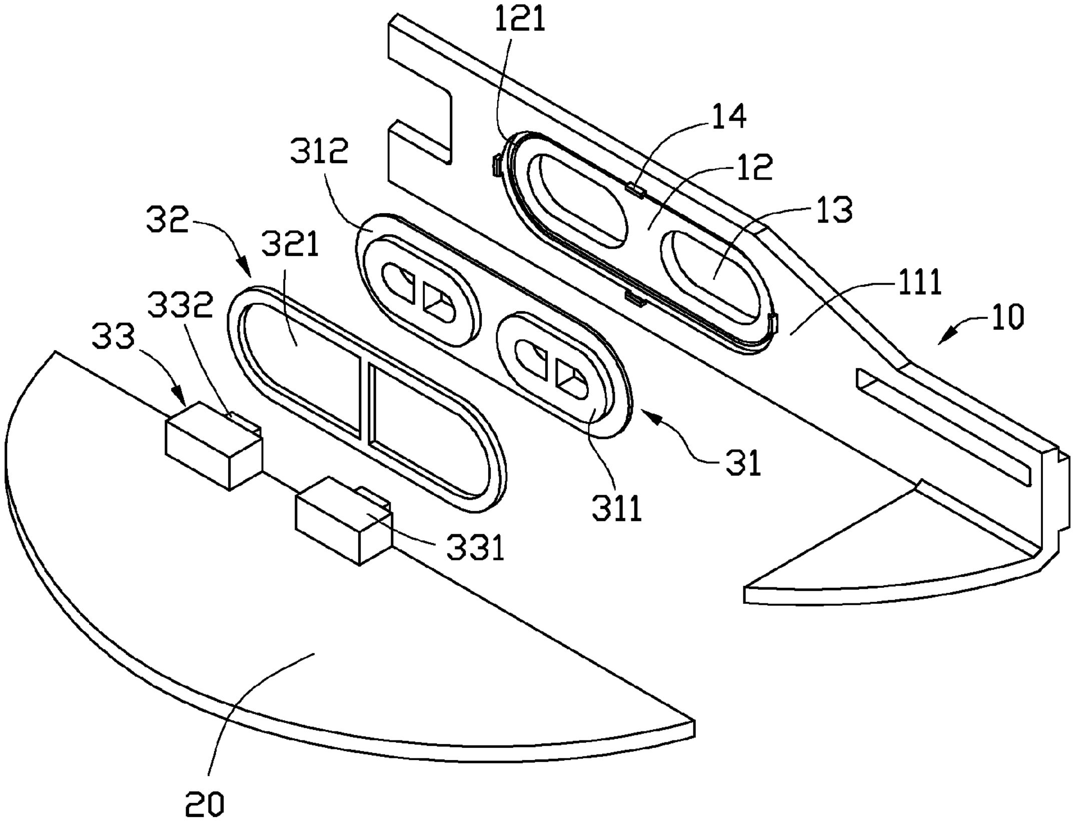
FIG. 3 is an isometric, exposed view of the electronic device of FIG. 2.
Figure 4:
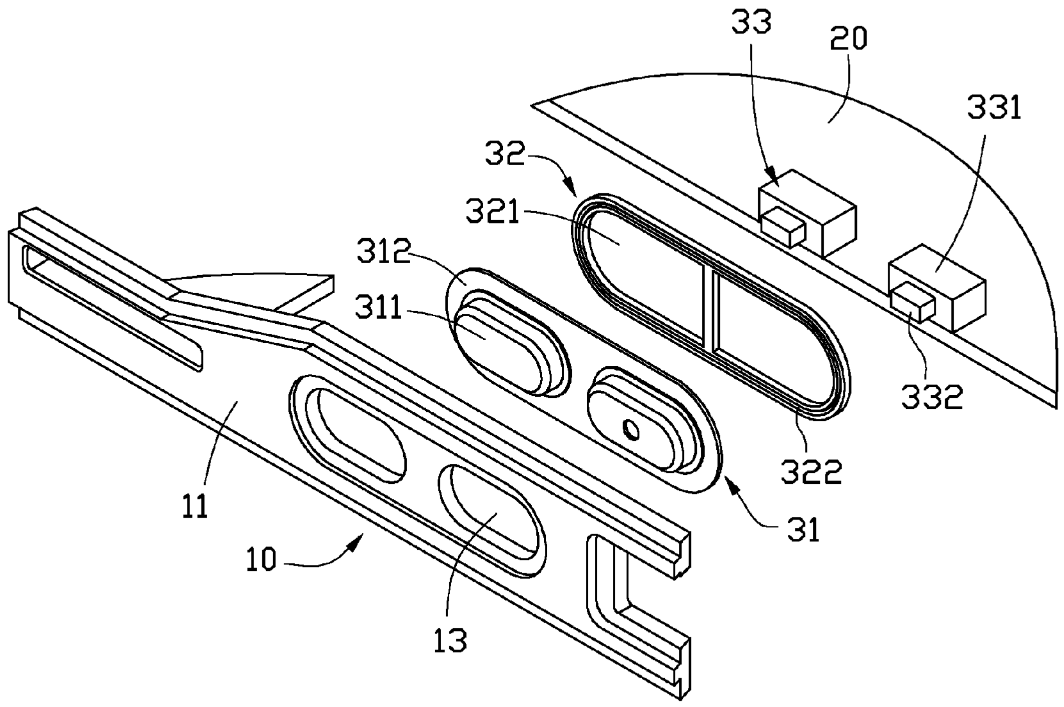
FIG. 4 is another isometric, exposed view of the electronic device of FIG. 2, but viewed from another viewpoint.

Referring to FIGS. 3-4, the housing 10 includes a sidewall 11 having an inner surface 111 that defines a recess 12. The recess 12 is used to receive a portion of the button assembly 30. The recess 12 includes a first latching member 121. In the embodiment, the first latching member 121 is a protruding rib. In other embodiments, the first latching member 121 can be a recessed slot. The bottom of the recess 12 defines at least one through hole 13. In the embodiment, the number of through holes 13 is two. The button assembly 30 extends through the through hole 13. In other embodiments, the number of the through holes 13 may be varied according to need. At least two resisting protrusions 14 protrude from the inner sidewall 111 of the housing 10 and are arranged around the rim of the recess 12. In the embodiment, the number of the resisting protrusions 14 is four.

The button assembly 30 includes a button body 31, a sealing frame 32, and two switches 33. The button body 31 includes one keycap 311 for each switch 33 and a waterproof layer 312 from which the keycaps 311 protrude. The size of each keycap 311 matches that of the through hole 13, allowing each keycap 311 to extend through one through hole 13 and to be external to the housing 10. The waterproof layer 312 is made of elastic waterproof material. The keycaps 311 and the waterproof layer 312 are integrally formed. In an alternative embodiment, the keycaps 311 and the waterproof layer 312 may be separate elements that are connected together. The waterproof layer 312 provides a rebound force to return the keycaps 311 to default position. The size of the waterproof layer 312 is the same as that of the recess 12. The waterproof layer 312 is capable of being partly received in the recess 12 and arranged between the sidewall 11 of the housing 10 and the sealing frame 32.

The size of the sealing frame 32 is the same as that of the recess 12. The sealing frame 32 is capable of being received in the recess 12. When the sealing frame 32 is received in the recess 12, the sealing frame 32 is limited by the resisting protrusion 14 to be fixed within the recess 12 of the housing 10. The waterproof layer 312 is fixed between the recess 12 of the housing 10 and the sealing frame 32. The sealing frame 32 defines two through holes 321. The size of each through hole 321 matches that of each keycap 311, allowing each keycap 311 to extend through one through hole 321. The surface of the sealing frame 32 facing the recess 12 further includes a second latching member 322. In the embodiment, the second latching member 322 is a recessed slot having a shape corresponding to the first latching member 121. In other embodiments, the second latching member 322 may be protruding ribs having a shape corresponding to the first latching member 121. The first latching member 121 engages the second latching member 322 to press the waterproof layer 312 corresponding to the first latching member 121 and the second latching member 322, causing the waterproof layer 312 to be partly deformed, which creates a waterproof seal.

In the embodiment, the two switches 33 are biased push-button switches. Each switch 33 is electrically connected to the PCB 20. Each switch 33 generates a signal when one of the keycaps 311 actuates the corresponding switch 33.

Figure 5:
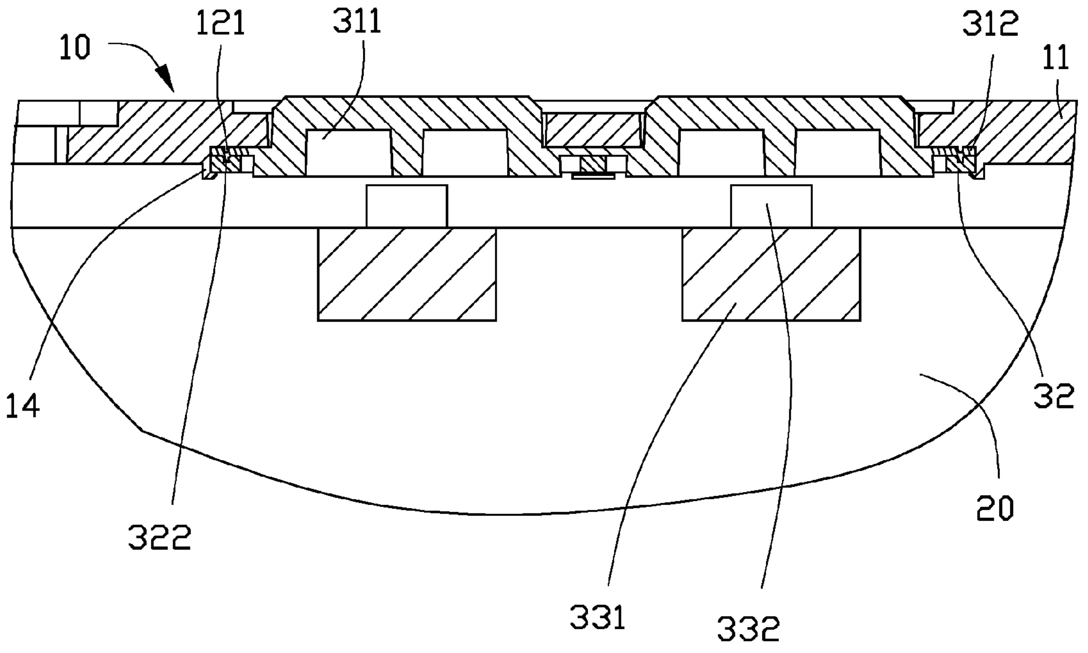
FIG. 5 is a cross-sectional view taken along line V-V of FIG. 2.

Referring to FIG. 5, to assemble the button assembly 30, the button body 31 is first connected to the housing 10, with the keycaps 311 extending through the through holes 13 of the housing 10 and the waterproof layer 312 being received in the recess 12. The sealing frame 32 is received in the recess 12, causing the sealing frame 32 to be fixed within the recess 12 of the housing 10 by the resisting protrusion 14. Thus, the waterproof layer 312 corresponding to the first latching member 121 and the second latching member 322 is deformed by the first latching member 121 and the second latching member 322, which creates a waterproof seal.

When depressed, the keycap 311 moves inward to actuate the switch 33 to generate a corresponding signal. When the keycap 311 is released, the keycap 311 rebounds by force of the waterproof layer 312.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An electronic device comprising:

a housing defining at least one through hole and comprising a first latching member; and a button assembly comprising a button body and a sealing frame, the button body comprising at least one keycap and a waterproof layer, each of the at least one keycap extending through one of the at least one through hole and being exposed to the housing, the waterproof layer being made of elastic waterproof material, the sealing frame comprising a second latching member being fixed to the housing;

wherein, a part of the waterproof layer is deformed by the first latching member and the second latching member, which creates waterproof seal.

2. The electronic device as described in claim 1, wherein the waterproof layer and the keycap are integrally formed.

3. The electronic device as described in claim 1, wherein the waterproof layer and the keycap are separately elements that are connected together.

4. The electronic device as described in claim 1, wherein the housing further comprises at least two resisting protrusions configured to limit the sealing frame to be fixed to the housing.

5. The electronic device as described in claim 1, wherein the first latching member is a protruding rib, the second latching member is a recessed slot with a shape corresponding to the protruding rib.

6. The electronic device as described in claim 1, wherein the first latching member is a recessed slot, the second latching member is a protruding rib with a shape corresponding to the recessed slot.

7. The electronic device as described in claim 4, wherein the housing further defines a recess, the resisting protrusions are arranged around the rim of the recess.

8. The electronic device as described in claim 7, wherein the first latching member is arranged on the bottom of the recess.

9. The electronic device as described in claim 1 further comprising at least one switch configured to generate a signal when the at least one switch is actuated by one keycap.

* * * * *